US010103349B2

(12) United States Patent
Wu et al.

(10) Patent No.: US 10,103,349 B2
(45) Date of Patent: Oct. 16, 2018

(54) ELECTROLUMINESCENT DEVICE AND MANUFACTURING METHOD THEREOF, DISPLAY SUBSTRATE AND DISPLAY DEVICE

(71) Applicants: Boe Technology Group Co., Ltd., Beijing (CN); Ordos Yuansheng Optoelectronics Co., Ltd., Inner Mongolia (CN)

(72) Inventors: Haidong Wu, Beijing (CN); Minghua Xuan, Beijing (CN); Weilin Lai, Beijing (CN); Xiang Feng, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/322,568

(22) PCT Filed: Nov. 6, 2015

(86) PCT No.: PCT/CN2015/093961
§ 371 (c)(1),
(2) Date: Dec. 28, 2016

(87) PCT Pub. No.: WO2016/188041
PCT Pub. Date: Dec. 1, 2016

(65) Prior Publication Data
US 2017/0133622 A1    May 11, 2017

(30) Foreign Application Priority Data
May 26, 2015  (CN) .......................... 2015 1 0275553

(51) Int. Cl.
*H01L 29/08*    (2006.01)
*H01L 51/52*    (2006.01)
(Continued)

(52) U.S. Cl.
CPC ...... *H01L 51/5231* (2013.01); *H01L 27/3276* (2013.01); *H01L 51/5008* (2013.01);
(Continued)

(58) Field of Classification Search
CPC ............ H01L 51/5231; H01L 27/3276; H01L 51/5215; H01L 51/5072; H01L 51/50008;
(Continued)

(56) References Cited

U.S. PATENT DOCUMENTS 6,687,266 B1 *  2/2004  Ma ........................ C09K 11/06
                                                257/141
6,885,025 B2 *  4/2005  Tung ................... H01L 51/5016
                                                257/40
2005/0006641 A1 *  1/2005  Tung ................... H01L 51/5016
                                                257/40

FOREIGN PATENT DOCUMENTS

AU         4833800       12/2000
CN         101345292     1/2009
(Continued)

OTHER PUBLICATIONS

English translation of CN102683602A by Zhou et al date Sep. 19, 2012.*
(Continued)

*Primary Examiner* — Thinh T Nguyen
(74) *Attorney, Agent, or Firm* — Calfee, Halter & Griswold LLP

(57) ABSTRACT

The embodiments of the present invention provide an electroluminescent device and manufacturing method thereof, display substrate and display device, which relate to the field
(Continued)

of display technology. The overall luminous efficiency of the OLED device is improved without reducing the thickness of the metal cathode, ensuring a good display effect of the OLED device. The electroluminescent device comprises a metal cathode layer, a functional layer and a transparent anode layer arranged on a basal substrate; the transparent anode layer is located on the light exit side of the electroluminescent device; the functional layer is located between the metal cathode layer and the transparent anode layer; the functional layer comprises an electron transport layer, an emitting layer and a hole transport layer sequentially arranged from the metal cathode layer.

9 Claims, 3 Drawing Sheets

(51) Int. Cl.
    *H01L 51/56*     (2006.01)
    *H01L 27/32*     (2006.01)
    *H01L 51/50*     (2006.01)

(52) U.S. Cl.
    CPC ...... *H01L 51/5012* (2013.01); *H01L 51/5056* (2013.01); *H01L 51/5072* (2013.01); *H01L 51/5088* (2013.01); *H01L 51/5092* (2013.01); *H01L 51/5096* (2013.01); *H01L 51/5215* (2013.01); *H01L 51/56* (2013.01); *H01L 2227/323* (2013.01); *H01L 2251/306* (2013.01); *H01L 2251/308* (2013.01); *H01L 2251/558* (2013.01)

(58) Field of Classification Search
    CPC ............. H01L 51/5092; H01L 51/5096; H01L 51/5088; H01L 51/56; H01L 2251/306; H01L 2251/308
    USPC .... 257/40, 59, 72, 99, E51.022; 438/82, 99, 438/48, 128

See application file for complete search history.

(56) References Cited

FOREIGN PATENT DOCUMENTS

| | | |
|---|---|---|
| CN | 101359721 | 2/2009 |
| CN | 101459226 | 6/2009 |
| CN | 101694868 | 4/2010 |
| CN | 102074660 | 5/2011 |
| CN | 102683602 | 9/2012 |
| CN | 103219472 | 7/2013 |
| CN | 103219476 | 7/2013 |
| CN | 103594653 | 2/2014 |
| CN | 104538554 | 4/2015 |
| CN | 104882567 | 9/2015 |
| DE | 10332953 | 2/2005 |

OTHER PUBLICATIONS

English translation of CN101359721A by Xie et al. date Feb. 4, 2009.*
Decision of Rejection from Chinese Patent Application No. 201510275553.2 dated Apr. 5, 2017.
The International Search Report for the application PCT/CN2015/093961 dated Feb. 4, 2016.
Office Action from China Application No. 201510275553.2 dated Jul. 28, 2016.
Office Action from China Application No. 201510275553.2 dated Dec. 19, 2016.

* cited by examiner

US 10,103,349 B2

ELECTROLUMINESCENT DEVICE AND MANUFACTURING METHOD THEREOF, DISPLAY SUBSTRATE AND DISPLAY DEVICE

RELATED APPLICATIONS

The present application is the U.S. national phase entry of the international application PCT/CN2015/093961, with an international filing date of Nov. 6, 2015, which claims the benefit of Chinese Patent Application No. 201510275553.2, filed on May 26, 2015, the entire disclosures of which are incorporated herein by reference.

TECHNICAL FIELD

The present invention relates to the field of display technology, in particular to an electroluminescent device and manufacturing method thereof, display substrate and display device.

BACKGROUND

The main light emitting mode for OLED devices in AM-OLED (active matrix-organic light-emitting display) display is emitting light from the cathode side; as shown in FIG. 1, an anode 040 and a cathode 020 are respectively located on both sides of a functional layer 030. When an electric field more than a certain threshold is applied on the anode 040 and the cathode 020, holes and electrons enter the light emitting layer of the functional layer 030 respectively from the anode 040 and cathode 020; then the radiative recombination causes luminescence; as shown with the arrow in the drawing, the light is emitted from the cathode 020 side, so as to realize display.

However, the transmittance of the cathode is relatively low since it is typically made of metals and/or alloy materials with a low work function; in order to reduce the influence of the cathode on the overall luminous efficiency of the OLED device, the thickness of the cathode should be smaller. However, when the thickness of the cathode is small, the surface resistance Rs (Rs=ρ/t, ρ is the resistivity, t is the thickness) will increase significantly, resulting in a high driving voltage of the OLED device, increasing the energy consumption.

SUMMARY

The embodiments of the present invention provide an electroluminescent device and manufacturing method thereof, display substrate and display device. The overall luminous efficiency of the OLED device is improved without reducing the thickness of the metal cathode, ensuring a good display effect of the OLED device.

To this end, the embodiments of the present invention provide the following solutions.

In an aspect, an embodiment of the present invention provides an electroluminescent device. The electroluminescent device comprises a metal cathode layer, a functional layer and a transparent anode layer arranged on a basal substrate; the transparent anode layer is located on the light exit side of the electroluminescent device; the functional layer is located between the metal cathode layer and the transparent anode layer; the functional layer comprises an electron transport layer, an emitting layer and a hole transport layer sequentially arranged from the metal cathode layer.

Optionally, the electroluminescent device further comprises: a transparent conductive layer located between the basal substrate and the metal cathode layer. The transparent conductive layer contacts the metal cathode layer.

Further optionally, the transparent conductive layer is made of any one of indium tin oxide, indium zinc oxide, fluorine doped tin oxide, gallium indium tin oxide, and zinc indium tin oxide.

Further optionally, the thickness of the transparent conductive layer is 10-20 nm.

Further optionally, the electroluminescent device further comprises: a transparent buffer layer located between the functional layer and the transparent anode layer. The hole mobility of the transparent buffer layer is greater than or equal to $10^{-5}$ $cm^2 \cdot s^{-1} \cdot V^{-1}$.

Further optionally, the thickness of the transparent buffer layer is 50-150 nm.

On the basis of the above, optionally, the thickness of the metal cathode layer is 20-100 nm.

On the basis of the above, optionally, the functional layer further comprises: at least one of an electron injection layer, an electron blocking layer and a hole injection layer. The electron injection layer is located between the metal cathode layer and the electron transport layer; the electron blocking layer is located between the emitting layer and the hole transport layer; the hole injection layer is located between the hole transport layer and the transparent anode layer.

An embodiment of the present invention further provides a method for manufacturing an electroluminescent device. The method comprises: forming a metal cathode layer, a functional layer and a transparent anode layer on a basal substrate. The formed transparent anode layer is located on the light exit side of the electroluminescent device; the formed functional layer is located between the metal cathode layer and the transparent anode layer; the functional layer comprises an electron transport layer, an emitting layer and an hole transport layer sequentially arranged from the metal cathode layer.

Optionally, after forming the functional layer and before forming the transparent anode layer, the method further comprises: forming a transparent buffer layer on the formed functional layer. The hole mobility of the transparent buffer layer is greater than or equal to $10^{-5}$ $cm^2 \cdot s^{-1} \cdot V^{-1}$.

Optionally, the thickness of the transparent buffer layer is 50-150 nm.

On the basis of the above, optionally, the transparent anode layer is formed with a low temperature film forming process. The film forming temperature of the low temperature film forming process is lower than or equal to 100° C.

Optionally, the low temperature film forming process comprises at least one of negative ion beam sputtering and low temperature chemical vapor deposition.

Further optionally, before forming the metal cathode layer, the method further comprises: forming a transparent conductive layer on the basal substrate. Forming the metal cathode layer comprises: forming a metal cathode layer on the transparent conductive layer. The transparent conductive layer contacts the metal cathode layer.

Optionally, forming the functional layer further comprises: forming at least one of an electron injection layer, an electron blocking layer and a hole injection layer. Forming the electron injection layer comprises: after forming the metal cathode layer and before forming the electron transport layer, forming an electron injection layer. Forming the electron blocking layer comprises: after forming the emitting layer and before forming the hole transport layer, forming an electron blocking layer. Forming the hole injection layer comprises: after forming the hole transport layer and before forming the transparent anode layer, forming a hole injection layer.

In another aspect, an embodiment of the invention further provides a display substrate. The display substrate comprises the electroluminescent device located on a basal substrate, which electroluminescent device is provided by the abovementioned embodiments.

An embodiment of the invention further provides a method for manufacturing a display substrate. The method comprises: forming an electroluminescent device on a basal substrate. The electroluminescent device is formed with the method according to any one of the abovementioned embodiments.

In yet another aspect, an embodiment of the invention further provides a display device. The display device comprises the abovementioned display substrate.

The embodiments of the present invention provide an electroluminescent device and manufacturing method thereof, display substrate and display device. In the electroluminescent device, the light excited from the functional layer can be emitted from the side of the transparent anode layer, the obstruction to light due to the metals and/or alloy materials with low transmittance can then be avoided. The overall luminous efficiency of the electroluminescent device is improved without reducing the thickness of the metal cathode, ensuring a good display effect of the electroluminescent device. Moreover, since the metal cathode layer with low transmittance is not used as a light exit surface, the thickness of the metal cathode layer can be large, thereby reducing the surface resistance of the metal cathode layer, reducing the driving voltage of the device, and avoiding the increase of energy consumption

BRIEF DESCRIPTION OF THE DRAWINGS

In order to more clearly illustrate the technical solutions in embodiments of the invention or in the prior art, the appended drawings needed to be used in the description of the embodiments or the prior art will be introduced briefly in the following. Obviously, the drawings in the following description are only some embodiments of the invention, and for those of ordinary skills in the art, other drawings may be obtained according to these drawings under the premise of not paying out creative work.

REFERENCE SIGNS

Figure 1:
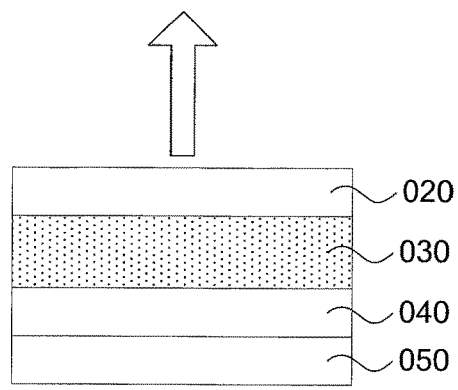
FIG. 1 is a structural schematic diagram of a section view for an OLED device provided by the prior art.

01—electroluminescent device; 10—basal substrate; 20—metal cathode layer; 30—functional layer; 31—electron transport layer; 32—emitting layer; 33—hole transport layer; 34—electron injection layer; 35—electron blocking layer; 36—hole injection layer; 40—transparent anode layer; 50—transparent conductive layer; 60—transparent buffer layer.

DETAILED DESCRIPTION OF THE INVENTION

In the following, the technical solutions in embodiments of the invention will be described clearly and completely in connection with the drawings in the embodiments of the invention. Obviously, the described embodiments are only part of the embodiments of the invention, and not all of the embodiments. Based on the embodiments in the invention, all other embodiments obtained by those of ordinary skills in the art under the premise of not paying out creative work pertain to the protection scope of the invention.

It should be noted that unless otherwise defined, all the terminology used in the embodiments of the invention (including technical and scientific terminology) has the same meaning as the common technician in the field of the invention. It should also be understood that the terminologies, such as those defined in the dictionaries, should be interpreted as having the meaning consistent with their meanings in the context of the relevant technology, without applying idealized or overly formalized meanings, unless expressly defined herein.

Moreover, the terms such as "on" and "under" used in the specification and claims of the present invention indicate directions or positions based on the relation of the directions or positions shown in the drawings, only for facilitating the description of the invention and simplifying the description, rather than indicating or implying that the devices or components should have be arranged in specific directions, or should be constructed and operated at specific positions, and therefore cannot be understood as limiting the invention.

Figure 3:
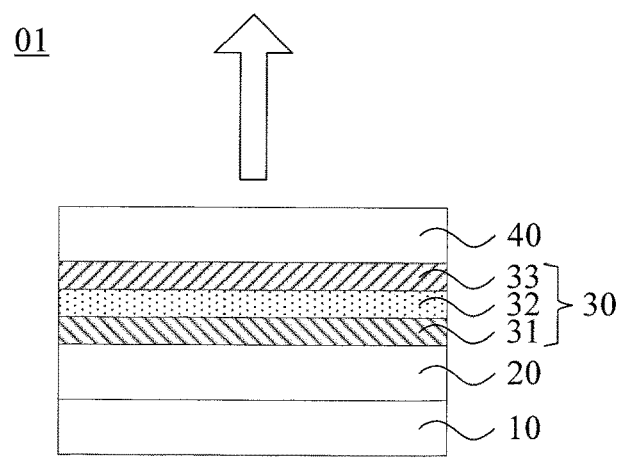
FIG. 3 is a first structural schematic diagram of a section view for an electroluminescent device according to an embodiment of the present invention.

An embodiment of the present invention provides an electroluminescent device. As shown in FIG. 3, the electroluminescent device 01 comprises a metal cathode layer 20, a functional layer 30 and a transparent anode layer 40 arranged on a basal substrate 10; the transparent anode layer 40 is located on the light exit side of the electroluminescent device 01; the functional layer 30 is located between the metal cathode layer 20 and the transparent anode layer 40; the functional layer 30 comprises an electron transport layer (ETL) 31, an emitting layer (EL) 32 and a hole transport layer (HTL) 33 sequentially arranged from the metal cathode layer 20.

It should be noted that, firstly, the basal substrate 10 for forming the electroluminescent device 01 can also be formed with structures such as a TFT array in advance, which is not limited herein.

The transparent anode layer 40 is located on the light exit side of the electroluminescent device 01; as shown in FIG. 3, the light emitting mode of the electroluminescent device 01 is top emitting; certainly, the light emitting mode of the electroluminescent device 01 can also be bottom emitting. In the embodiments of the present invention, the formed electroluminescent device 01 may be e.g. an OLED device The electroluminescent device 01 can be applied to a display device, such as an AM-OLED, and then each device can be connected to the TFT (thin film transistor) in the array substrate. By independently controlling the device with addressing corresponding TFT, each pixel can be independently regulated, facilitating the implement of colorful OLED. Since the TFT arranged on the array substrate and signal lines such as gate lines and data lines connected with the TFT are not transparent, optionally, in an embodiment of the invention, taking the light emitting mode shown in FIG. 3 as an example, the light emitting mode of the electroluminescent device 01 is top emitting, so that the light generated by electronic-hole recombination is emitted as much as possible to effectively realize display. Certainly, the structure of the electroluminescent device 01 provided by the embodiment of the invention can also be used for bottom emitting, so as to improve the light emitting efficiency of the bottom emitting device in the prior art; the difference between the bottom emitting device and the top emitting device is the location with respect to the array substrate, which is not repeated herein.

Secondly, the metal cathode layer 20 can be made of at least one metal material of Mg, Ag, Al, Li, K and Ca. That is, the metal cathode layer 20 can be made of simple substance of a metal element, it can also be made of metal alloy consisting of two or more kinds of the above metal elements, such as $Mg_xAg_{(1-x)}$, $Li_xAl_{(1-x)}$, $Li_xCa_{(1-x)}$ or $Li_xAg_{(1-x)}$, $0<x<1$.

The transparent anode layer 40 can be made of any one of indium tin oxide (ITO), indium zinc oxide (IZO), fluorine doped tin oxide (FTO), gallium indium tin oxide (GITO, of which the specific chemical formula can be e.g. $Ga_{0.08}In_{0.28}Sn_{0.64}O_3$) and zinc indium tin oxide (ZITO, of which the specific chemical formula can be e.g. $Zn_{0.64}In_{0.88}Sn_{0.66}O_3$).

In an embodiment of the invention, the work function of transparent conductive material is greater than 5 eV, which is beneficial to the full excitation of the hole, thereby increasing the current.

The thickness of the transparent anode layer 40 can be 10-100 nm. Within such a range, the transmittance of the transparent anode layer 40 is relatively high, while a high surface resistance of the anode due to small thickness can also be avoided.

Thirdly, for example, the ETL can be made of oligothiophene derivatives, triazole derivatives, quinoxaline derivatives, perfluorinated aromatic compounds; the EL can be made of $Alq_3$ (Aluminum 8-hydroxyquinolinate) and its derivatives; the HTL can be made of triphenylamine derivatives and some polymers, which is not limited herein.

On this basis, in the electroluminescent device 01 provided by the embodiment of the invention, the metal cathode layer 20 with a low transmittance is not used as a light exit side; the transparent anode layer 40 is used as a light exit side. The light excited in the functional layer 30 is then emitted from side of the transparent anode layer 40. The obstruction to light due to the metals and/or alloy materials with low transmittance can then be avoided; the overall light emitting efficiency of the electroluminescent device 01 is relatively high.

Figure 2:
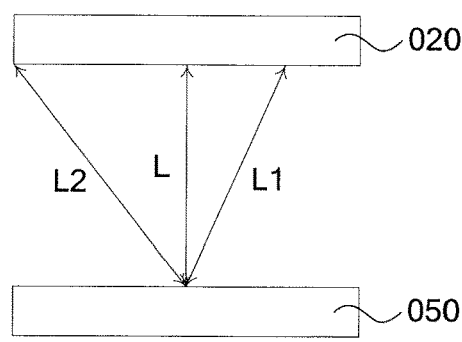
FIG. 2 is a schematic diagram of the micro cavity effect caused in an OLED device provided by the prior art.

As shown in FIG. 1, in the prior art, the cathode is usually applied on the light exit side of the device. The cathode is equivalent to a translucent film with reflective function. Further, as shown in FIG. 2, the cathode and the metal reflective layer 050 located beneath the anode layer 050 form a micro cavity, which will generate a micro cavity effect. There is a relationship between the cavity length L of the micro cavity and the light wavelength λ emitted by the OLED devices:

$$L = \sum_{i=1}^{n} n_i \cdot d_i + \frac{\lambda \cdot \varphi_{m1}}{4\pi} + \frac{\lambda \cdot \varphi_{m2}}{4\pi} = m \cdot \frac{\lambda}{2};$$

-continued
$$\varphi_m = \arctan\left(\frac{2n_s \cdot k_m}{n_m^2 + k_m^2 - n_s^2}\right).$$

$n_i$ is the refractive index of the organic material of the respective layer in the functional layer; $d_i$ is the thickness of respective organic layer in the functional layer; $\varphi_m$ is the depth of light into the metal layer; k is the light extinction coefficient of the respective organic layer; $n_s$ is the refractive index of the respective organic layer; $k_m$ is the light extinction coefficient of the metal layer; $n_m$ is the refractive index of the metal layer; and m is a positive integer.

A micro cavity has selectivity to light wave; therefore, an OLED device with a specific cavity length can only emit light with specific wavelength. At different viewing angle, the actual length of the cavity will change: as shown in FIG. 2, the cavity length L for an observer located in front of the OLED device is different with the cavity length L1 and L2 for an observer in a slant viewing angle. For observers in different viewing angles, this will lead to observing different wavelengths λ emitted from the OLED device, resulting in a viewing angle defect for the OLED device, causing bad display.

In the electroluminescent device 01 provided by the embodiment of the invention, the transparent anode layer 40 applied on the light exit side is made of a material with a relatively high transmittance (such as ITO and IZO); micro cavity effect will thus not exist between the transparent anode layer 40 and the metal cathode layer 20. The viewing angle defect of the electroluminescent device caused by micro cavity effect can then be avoided, in which electroluminescent device the metal cathode layer 20 is on the top. A good display effect can be ensured.

Moreover, in the electroluminescent device 01 provided by the embodiment of the invention, the light is emitted from the side of the transparent anode layer 40. FIG. 3 exemplarily shows a top emitting mode. A part of the light generated by electron-hole radiative recombination is emitted from the top of the transparent anode layer 40; the other part will be emitted to the bottom of the device. Therefore, the thickness of the metal cathode layer 20 can be large, so that the metal cathode layer 20 has the function of the reflective metal layer in the prior art; namely, after the light beam emitted downwards is reflected by the metal cathode layer 20, the light beam is emitted upwards from the side of the transparent anode layer 40, so as to further improve the light emitting efficiency of the device. Further, since the opaque metal cathode layer 20 in the electroluminescent device 01 also has the function of a reflective metal layer, the thickness of the metal cathode layer 20 can be large, such as 20-100 nm, so as to reduce the surface resistance of the metal cathode layer 20, reducing the driving voltage of the device, avoiding increase of energy consumption.

Figure 7:
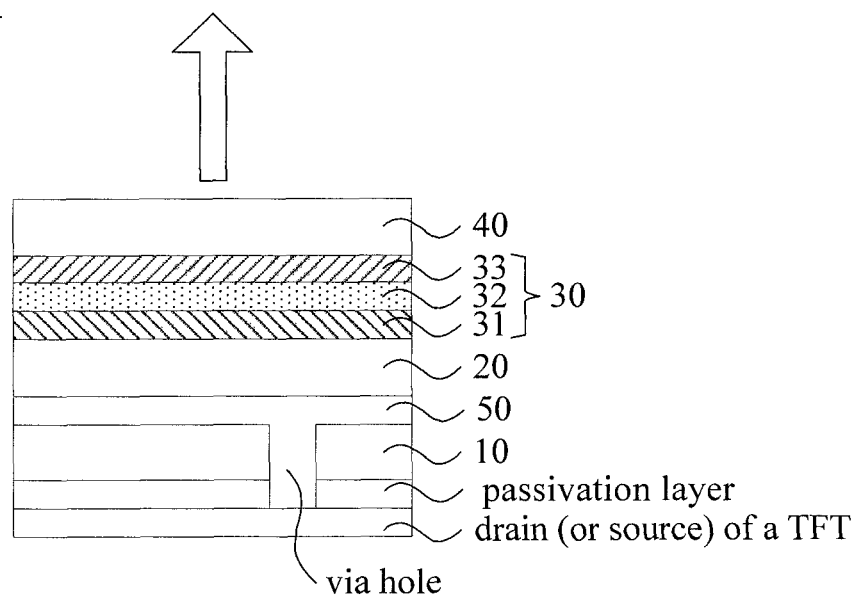
FIG. 7 is a structural schematic diagram of a section view for an electroluminescent device according to another embodiment of the present invention.

The electroluminescent device 01 is typically used in an AMOLED. That is, each device can be independently controlled by addressing a TFT. As shown in FIG. 7, the metal cathode layer 20 located on the bottom of the electroluminescent device 01 is connected to a drain (or source) of a TFT through a via hole on a passivation layer, so as to realize independent control on each device by addressing. Since the thickness of the passivation layer is large, the depth of the via hole is relatively large; the metal cathode layer 20 is formed with a simple substance of a metal element and/or alloy, faults may occur in the via hole, causing a poor connection for the metal cathode layer 20 and TFT, affecting the normal display of AMOLED.

Figure 4:
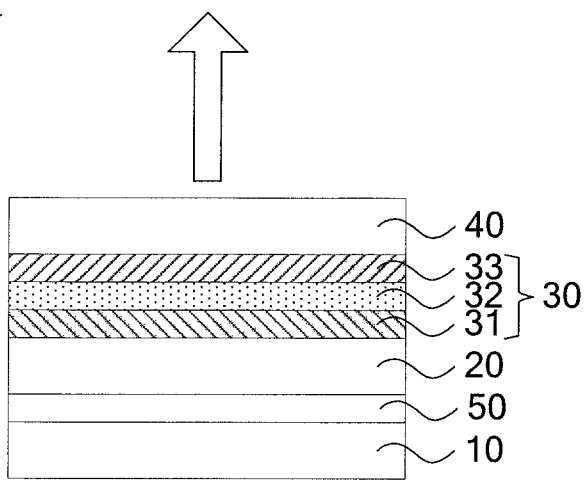
FIG. 4 is a second structural schematic diagram of a section view for an electroluminescent device according to an embodiment of the present invention.

Therefore, as shown in FIG. 4, the electroluminescent device 01 further comprises: a transparent conductive layer 50 located between the basal substrate 10 and the metal cathode layer 20. The transparent conductive layer 50 contacts the metal cathode layer 20; therefore, during the operation of the electroluminescent device, the transparent conductive layer 50 is electrically connected to the metal cathode layer 20.

In an embodiment of the invention, the transparent conductive layer 50 is made of any one of indium tin oxide (ITO), indium zinc oxide (IZO), fluorine doped tin oxide (FTO), gallium indium tin oxide (GITO, of which the specific chemical formula can be e.g. $Ga_{0.08}In_{0.28}Sn_{0.64}O_3$) and zinc indium tin oxide (ZITO, of which the specific chemical formula can be e.g. $Zn_{0.64}In_{0.88}Sn_{0.66}O_3$).

The abovementioned transparent conductive material is not apt to produce the issue of fault during deposition in the via hole; therefore, the connection between the electroluminescent device 01 and TFT can be ensured to realize independent control on each device by addressing.

Optionally, the thickness of the metal cathode layer is 20-100 nm. Such a thickness can ensure that no fault is produced during connecting the transparent conductive layer 50 with the TFT through a via hole on the passivation layer. Moreover, the overall thickness of the device is not increased significantly.

Figure 5:
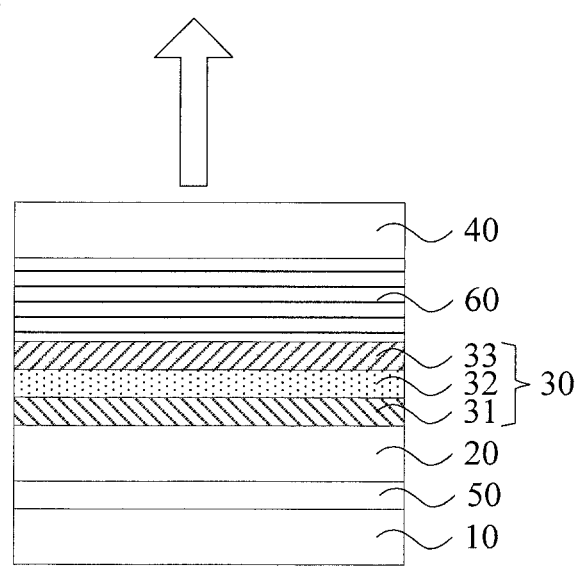
FIG. 5 is a third structural schematic diagram of a section view for an electroluminescent device according to an embodiment of the present invention.

As shown in FIG. 5, the electroluminescent device 01 further comprises: a transparent buffer layer 60 located between the functional layer 30 and the transparent anode layer 40. The hole mobility of the transparent buffer layer 60 is greater than or equal to $10^{-5}$ $cm^2 \cdot s^{-1} \cdot V^{-1}$.

Since in the embodiment the hole mobility of the transparent buffer layer 60 is greater than or equal to $10^{-5}$ $cm^2 \cdot s^{-1} \cdot V^{-1}$, the hole injection and transmission ability can be improved during operation of the electroluminescent device 01, enhancing the current efficiency of the device.

Exemplarily, the material for forming the transparent buffer layer 60 can be an organic material with a hole mobility greater than or equal to $10^{-5}$ $cm^2 \cdot s^{-1} \cdot V^{-1}$, such as TNATA (4,4',4'-tris[2-naphthyl(phenyl)amino]triphenylamine), CuPc (Copper(II) phthalocyanine) and PEDOT-PSS (poly(3,4-oxyethyleneoxythiophene)/poly(styrene sulfonate)).

Further, the thickness of the transparent buffer layer 60 is 50-150 nm. The transparent buffer layer with such a thickness has the transition function for the transparent anode layer 40 and the functional layer 30; it can also prevent the functional layer 30 below from being affected by the process conditions such as temperature and reaction source for preparing the transparent anode layer 40, thereby ensuring a good performance of the device.

Figure 6:
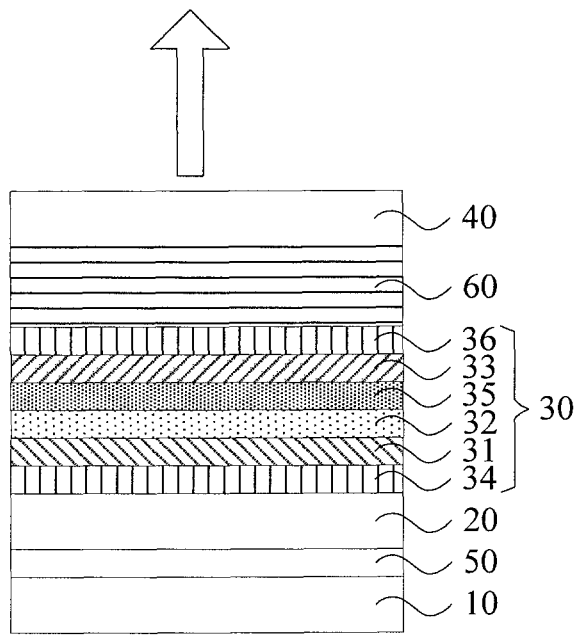
FIG. 6 is a fourth structural schematic diagram of a section view for an electroluminescent device according to an embodiment of the present invention.

On the basis of above, as shown in FIG. 6, the functional layer 30 further comprises: at least one of an electron injection layer (EIL) 34, an electron blocking layer (EBL) 35 and a hole injection layer (HIL) 36.

The electron injection layer 34 is located between the metal cathode layer 20 and the electron transport layer 31; the function of the electron injection layer 34 is to enhance the electron injection efficiency for the electrons excited from the metal cathode layer 20 to the electron transport layer 31. For example, the electron injection layer 34 can be made of Liq (8-hydroxyquionline lithium).

The electron blocking layer 35 is located between the emitting layer 33 and the hole transport layer 32; the function of the electron blocking layer 35 is to prevent the electrons from penetrating the emitting layer 32 and producing radiative recombination with the holes in the hole transport layer 33; otherwise the light emitting efficiency is lowered. Exemplarily, the electron blocking layer 35 is made of an organic material such as TFB (poly(9,9-dioctylfluorene-co-N-(4-butylphenyl)diphenylamine)), TAPC (1,1-Bis (4-aminophenyl)cyclohexane) and NPB (N,N'-Bis-(1-naphthalenyl)-N,N'-bis-phenyl-(1,1'-biphenyl)-4,4'-diamine).

The hole injection layer 36 is located between the hole transport layer 40 and the transparent anode layer 33; the function of the hole injection layer 36 is to enhance the hole injection efficiency for the holes excited from the transparent anode layer 40 to the transparent anode layer 33. For example, the hole injection layer 36 can be made of CuPc (Copper(II) phthalocyanine).

It should be noted that, for clarity, the embodiment of the invention is exemplarily illustrated with FIG. 6, in which the functional layer 30 comprises 6 structural layers: HTL, EL, ETL, HIL, EBL and EIL.

Moreover, FIG. 6 is only illustrated as an embodiment, in which the electroluminescent device 01 comprises a transparent buffer layer 60. In this case, the hole injection layer 36 is located between the hole transport layer 33 and the transparent buffer layer 60 below the transparent anode layer 40.

If the electroluminescent device 01 does not comprise a transparent buffer layer 60, the hole injection layer 36 is located between the hole transport layer 33 and the transparent anode layer 40.

In the embodiments of the invention, the HTL, EL and ETL are three structural layers necessary for realizing electroluminescence. The HIL, EBL and EIL are three structural layers for further improving the light emitting efficiency. In addition to the HTL, EL and ETL, the functional layer 30 may comprise at least one of the HIL, EBL and EIL, which is not limited herein.

An embodiment of the invention further provides a display substrate. The display substrate comprises the electroluminescent device 01 located on a basal substrate 10, which electroluminescent device is provided by the abovementioned embodiments.

In an embodiment of the invention, the basal substrate 10 is e.g. an array substrate formed with a TFT array.

An embodiment of the present invention further provides a method for manufacturing the abovementioned electroluminescent device. The method comprises: forming a metal cathode layer 20, a functional layer 30 and a transparent anode layer 40 on a basal substrate 10 (shown in FIG. 3). The formed transparent anode layer 40 is located on the light exit side of the electroluminescent device 01; i.e., light is emitted from a side of the transparent anode layer 40. The formed functional layer 30 is located between the metal cathode layer 20 and the transparent anode layer 40; the functional layer 30 comprises an electron transport layer 31, an emitting layer 32 and an hole transport layer 33 sequentially arranged from the metal cathode layer 20.

It should be noted that, firstly, the step of forming the metal cathode layer 20, functional layer 30 and transparent anode layer 40 on the basal substrate 10 may comprises: sequentially forming the metal cathode layer 20, functional layer 30 and transparent anode layer 40; i.e., the light emitting mode of the electroluminescent device 01 is top emitting. Alternatively, the step of forming the metal cathode layer 20, functional layer 30 and transparent anode layer 40 on the basal substrate 10 may comprises: sequentially forming the transparent anode layer 40, functional layer 30 and metal cathode layer 20; i.e., the light emitting mode of the electroluminescent device 01 is bottom emitting.

The electroluminescent device 01 manufactured with the method can be applied to a display device, such as an AM-OLED, and then each device can be connected to the TFT (thin film transistor) in the array substrate. By independently controlling the device with addressing corresponding TFT, each pixel can be independently regulated, facilitating the implement of colorful OLED. Since the TFT arranged on the array substrate and signal lines such as gate lines and data lines connected with the TFT are not transparent, optionally, in an embodiment of the invention, taking the light emitting mode shown in FIG. 3 as an example, the light emitting mode of the electroluminescent device 01 is top emitting, so that the light generated by electronic-hole recombination is emitted as much as possible to effectively realize display. Certainly, the structure of the electroluminescent device 01 provided by the embodiment of the invention can also be used for bottom emitting, so as to improve the light emitting efficiency of the bottom emitting device in the prior art; the difference between the bottom emitting device and the top emitting device is the location with respect to the array substrate, which is not repeated herein.

Secondly, the metal cathode layer 20 can be formed with a process of vacuum evaporation, magnetron sputtering or ion beam sputtering, etc.; the layers in the functional layer 30 can be formed with a process of vacuum evaporation.

Moreover, in the electroluminescent device 01 provided by the embodiment of the invention, the metal cathode layer 20 with a low transmittance is not used as a light exit side; the transparent anode layer 40 is used as a light exit side. The light excited in the functional layer 30 is then emitted from side of the transparent anode layer 40. The obstruction to light due to the metals and/or alloy materials with low transmittance can then be avoided; the overall light emitting efficiency of the electroluminescent device 01 is relatively high. Furthermore, the transparent anode layer 40 applied on the light exit side is made of a material with a relatively high transmittance (such as ITO and IZO); micro cavity effect will thus not exist between the transparent anode layer 40 and the metal cathode layer 20. The viewing angle defect of the electroluminescent device caused by micro cavity effect can then be avoided, in which electroluminescent device the metal cathode layer 20 is on the top. A good display effect can be ensured.

Furthermore, in the electroluminescent device 01 provided by the embodiment of the invention, the light is emitted from the side of the transparent anode layer 40. A part of the light generated by electron-hole radiative recombination is emitted from the top of the transparent anode layer 40; the other part will be emitted to the bottom of the device. Therefore, the thickness of the metal cathode layer 20 can be large, so that the metal cathode layer 20 has the function of the reflective metal layer in the prior art; namely, as shown in FIG. 3, after the light beam emitted downwards is reflected by the metal cathode layer 20, the light beam is emitted upwards from the side of the transparent anode layer 40, so as to further improve the light emitting efficiency of the device. Further, since the opaque metal cathode layer 20 in the electroluminescent device 01 also has the function of a reflective metal layer, the thickness of the metal cathode layer 20 can be large, such as 20-100 nm, so as to reduce the surface resistance of the metal cathode layer 20, reducing the driving voltage of the device, avoiding increase of energy consumption.

After forming the functional layer 30 and before forming the transparent anode layer 40, the method further comprises: forming a transparent buffer layer 60 on the formed functional layer 30 (shown in FIG. 5). The hole mobility of the transparent buffer layer 60 is greater than or equal to $10^{-5}$ $cm^2 \cdot s^{-1} \cdot V^{-1}$.

The transparent buffer layer 60 can be formed with a process of vacuum evaporation. Since in the embodiment the hole mobility of the transparent buffer layer 60 is greater than or equal to $10^{-5}$ $cm^2 \cdot s^{-1} \cdot V^{-1}$, the hole injection and transmission ability can be improved during operation of the electroluminescent device 01, enhancing the current efficiency of the device.

Exemplarily, the material for forming the transparent buffer layer 60 can be an organic material with a hole mobility greater than or equal to $10^{-5}$ $cm^2 \cdot s^{-1} \cdot V^{-1}$, such as TNATA (4,4',4'-tris[2-naphthyl(phenyl)amino]triphenylamine), CuPc (Copper(II) phthalocyanine) and PEDOT-PSS (poly(3,4-oxyethyleneoxythiophene)/poly(styrene sulfonate)).

Further, the thickness of the transparent buffer layer 60 is 50-150 nm. The transparent buffer layer with such a thickness has the transition function for the transparent anode layer 40 and the functional layer 30; it can also prevent the functional layer 30 below from being affected by the process for preparing the transparent anode layer 40, thereby ensuring a good performance of the device.

The functional layer 30 under the transparent anode layer 40 is typically made of organic materials or inorganic semiconductor materials with poor resistance to high temperature. Therefore, if the transparent anode layer 40 is formed on the functional layer 30 using high temperature film forming process such as the traditional evaporation method and sputtering method, high temperature will cause damage to properties of the layers in the functional layer 30, affecting the light emitting performance of the electroluminescent device 01.

Therefore, in an embodiment of the invention, the transparent anode layer 40 is formed with a low temperature film forming process. The film forming temperature of the low temperature film forming process is lower than or equal to 100° C.

Optionally, the low temperature film forming process comprises at least one of negative ion beam sputtering and low temperature chemical vapor deposition.

Negative ion beam sputtering is a new coating technology based on vacuum evaporation and ionization technology.

For example, the transparent anode layer 40 to be plated is made of ITO material. The negative ion beam sputtering method has a significant advantage: the material particles to be plated in a form of negative ions (i.e., the above ITO material) are sprayed to the surface a substrate (i.e., the functional layer 30 or transparent buffer layer 60; the transparent buffer layer 60 is optionally selected as the substrate) at high speed in an electric field; due to the acceleration effect of the electric field, the negative ion beam has high kinetic energy and high chemical activity. The ITO film has good compactness and strong bonding force with the surface of the substrate. The film forming temperature is not required to be high, so that the film can be formed under low temperature lower than or equal to 100° C. (typically 50° C. is enough).

Low temperature chemical vapor deposition method is a vapor growth method for film material; one or more compounds and elemental gases containing elements for a film (i.e. the ITO) are sent into a reaction chamber in which a substrate (i.e. the above functional layer 30 or the transparent buffer layer 60; the transparent buffer layer 60 is optionally selected as the substrate) is placed; it is a process for depositing a solid state thin film on the surface of the substrate with space gas phase chemical reaction at low temperature.

The electroluminescent device 01 is typically used in an AMOLED. That is, each device can be independently controlled by addressing a TFT. The metal cathode layer 20 located on the bottom of the electroluminescent device 01 is connected to a drain (or source) of a TFT through a via hole on a passivation layer, so as to realize independent control on each device by addressing. Since the thickness of the passivation layer is large, the depth of the via hole is relatively large; the metal cathode layer 20 is formed with a simple substance of a metal element and/or alloy, faults may occur in the via hole, causing a poor connection for the metal cathode layer 20 and TFT, affecting the normal display of AMOLED.

Therefore, optionally, before forming the metal cathode layer 20, the method further comprises: forming a transparent conductive layer 50 on the basal substrate 10 (shown in FIG. 4). Accordingly, forming the metal cathode layer 20 comprises: forming a metal cathode layer 20 on the transparent conductive layer 50. The transparent conductive layer 50 contacts the metal cathode layer 20; therefore, during the operation of the electroluminescent device, the transparent conductive layer 50 is electrically connected to the metal cathode layer 20.

In an embodiment of the invention, the transparent conductive layer 50 can be formed with a process of magnetron sputtering or ion beam sputtering. The transparent conductive layer 50 can be made of any one of indium tin oxide (ITO), indium zinc oxide (IZO), fluorine doped tin oxide (FTO), gallium indium tin oxide (GITO, of which the specific chemical formula can be e.g. $Ga_{0.08}In_{0.28}Sn_{0.64}O_3$) and zinc indium tin oxide (ZITO, of which the specific chemical formula can be e.g. $Zn_{0.64}In_{0.88}Sn_{0.66}O_3$).

The abovementioned transparent conductive material is not apt to produce the issue of fault during deposition in the via hole; therefore, the connection between the electroluminescent device 01 and TFT can be ensured to realize independent control on each device by addressing.

Optionally, the thickness of the metal cathode layer is 20-100 nm. Such a thickness can ensure that no fault is produced during connecting the transparent conductive layer 50 with the TFT through a via hole on the passivation layer. Moreover, the overall thickness of the device is not increased significantly.

On the basis of the above, as shown in FIG. 6, forming the functional layer 30 further comprises: forming at least one of an electron injection layer (EIL) 34, an electron blocking layer (EBL) 35 and a hole injection layer (HIL) 36.

The step of forming the electron injection layer 34 comprises: after forming the metal cathode layer 20 and before forming the electron transport layer 31, forming an electron injection layer 34. The electron injection layer 34 is formed between the metal cathode layer 20 and the electron transport layer 31; the function of the electron injection layer 34 is to enhance the electron injection efficiency for the electrons excited from the metal cathode layer 20 to the electron transport layer 31. For example, the electron injection layer 34 can be made of Liq (8-hydroxyquionline lithium).

The step of forming the electron blocking layer comprises: after forming the emitting layer and before forming the hole transport layer, forming an electron blocking layer. The electron blocking layer 35 is formed between the emitting layer 33 and the hole transport layer 32; the function of the electron blocking layer 35 is to prevent the electrons from penetrating the emitting layer 32 and producing radiative recombination with the holes in the hole transport layer 33; otherwise the light emitting efficiency is lowered. Exemplarily, the electron blocking layer 35 is made of an organic material such as TFB (poly(9,9-dioctylfluorene-co-N-(4-butylphenyl)diphenylamine)), TAPC (1,1-Bis (4-aminophenyl)cyclohexane) and NPB (N,N'-Bis-(1-naphthalenyl)-N,N'-bis-phenyl-(1,1'-biphenyl)-4,4'-diamine).

The step of forming the hole injection layer comprises: after forming the hole transport layer and before forming the transparent anode layer, forming a hole injection layer. The hole injection layer 36 is formed between the hole transport layer 40 and the transparent anode layer 33; the function of the hole injection layer 36 is to enhance the hole injection efficiency for the holes excited from the transparent anode layer 40 to the transparent anode layer 33. For example, the hole injection layer 36 can be made of CuPc (Copper(II) phthalocyanine).

An embodiment of the invention further provides a method for manufacturing a display substrate. The method comprises: forming an electroluminescent device 01 on a basal substrate 10. The basal substrate 10 is e.g. an array substrate formed with a TFT array.

An embodiment of the invention further provides a display device. The display device comprises the abovementioned display substrate.

The display device can be any product or component with display function, such as OLED panel, OLED display, OLED TV, electronic paper, digital photo frame, mobile phone and tablet computer.

It should be noted that the drawings of the present invention are all simplified schematic diagrams of the electroluminescent device and the manufacturing method thereof. They are used to clearly describe the structures associated with the invention. Other structures having no relationship to the invention are existing structures, which are not reflected in the drawings or only embodied partially.

Apparently, the person skilled in the art may make various alterations and variations to the invention without departing the spirit and scope of the invention. As such, provided that these modifications and variations of the invention pertain to the scope of the claims of the invention and their equivalents, the invention is intended to embrace these alterations and variations.

What is claimed is:

1. An electroluminescent device comprising:
a metal cathode layer, a functional layer and a transparent anode layer arranged on a basal substrate; the transparent anode layer being located on the light exit side of the electroluminescent device; the functional layer being located between the metal cathode layer and the transparent anode layer; the functional layer comprising an electron transport layer, an emitting layer and a hole transport layer sequentially arranged from the metal cathode layer;
a transparent conductive layer located between the basal substrate and the metal cathode layer; wherein the transparent conductive layer contacts the metal cathode layer;
a passivation layer located on a side of the basal substrate facing away from the transparent conductive layer; and
a via hole penetrating the basal substrate and the passivation layer;
wherein a material of the transparent conductive layer is deposited in the via hole to form an electric connection to the metal cathode layer.

2. The electroluminescent device according to claim 1, wherein the transparent conductive layer is made of any one of indium tin oxide, indium zinc oxide, fluorine doped tin oxide, gallium indium tin oxide, and zinc indium tin oxide.

3. The electroluminescent device according to claim 1, wherein the thickness of the transparent conductive layer is 10-20 nm.

4. The electroluminescent device according to claim 1, further comprising:
 a transparent buffer layer located between the functional layer and the transparent anode layer;
 and wherein the hole mobility of the transparent buffer layer is greater than or equal to $10^{-5}$ $cm^2 \cdot s^{-1} \cdot V^{-1}$.

5. The electroluminescent device according to claim 4, wherein the thickness of the transparent buffer layer is 50-150 nm.

6. The electroluminescent device according to claim 1, wherein the thickness of the metal cathode layer is 20-100 nm.

7. The electroluminescent device according to claim 1, wherein the functional layer further comprises:
 at least one of an electron injection layer, an electron blocking layer and a hole injection layer;
 wherein the electron injection layer is located between the metal cathode layer and the electron transport layer;
 wherein the electron blocking layer is located between the emitting layer and the hole transport layer;
 and wherein the hole injection layer is located between the hole transport layer and the transparent anode layer.

8. A display substrate comprising the electroluminescent device according to claim 1 located on the basal substrate.

9. A display device comprising the display substrate according to claim 8.

* * * * *